(12) United States Patent
Mishra et al.

(10) Patent No.: US 6,610,144 B2
(45) Date of Patent: Aug. 26, 2003

(54) METHOD TO REDUCE THE DISLOCATION DENSITY IN GROUP III-NITRIDE FILMS

(75) Inventors: Umesh Kumar Mishra, Santa Barbara, CA (US); Stacia Keller, Goleta, CA (US)

(73) Assignee: The Regents of the University of California, Oakland, CA (US)

(*) Notice: Subject to any disclaimer, the term of this patent is extended or adjusted under 35 U.S.C. 154(b) by 110 days.

(21) Appl. No.: 09/908,964

(22) Filed: Jul. 19, 2001

(65) Prior Publication Data

US 2002/0069817 A1 Jun. 13, 2002

Related U.S. Application Data

(60) Provisional application No. 60/220,035, filed on Jul. 21, 2000.

(51) Int. Cl.[7] .............................................. C30B 25/02
(52) U.S. Cl. ........................ 117/95; 117/94; 117/105; 117/89; 117/952; 257/77; 257/84; 257/103
(58) Field of Search ........................... 257/77, 84, 103; 117/94, 95, 105, 952

(56) References Cited

U.S. PATENT DOCUMENTS

| | | | | |
|---|---|---|---|---|
| 5,272,108 A | * | 12/1993 | Kozawa | 437/127 |
| 5,874,747 A | * | 2/1999 | Redwing et al. | 257/77 |
| 5,877,038 A | * | 3/1999 | Coldren et al. | 438/39 |
| 5,930,656 A | * | 7/1999 | Furukawa et al. | 438/479 |
| 5,977,566 A | * | 11/1999 | Okazaki et al. | 257/99 |

FOREIGN PATENT DOCUMENTS

| | | | |
|---|---|---|---|
| EP | 955708 | * | 10/1999 |
| EP | 955709 | * | 10/1999 |

OTHER PUBLICATIONS

H. Amano et al., "Metalorganic Vapor Phase Epitaxial Growth of a High Quality GaN Film Using an AlN Buffer Layer," Appl. Phys. Lett., 1986, 48(5): 353–355.

T. Gehrke et al., "Pendeo–Epitaxy of Gallium Nitride and Aluminum Nitride Films and Heterostructure on Silicon Carbide Substrate," MRS Internet J. Semicond. Res. 4S1, G3.2, 1999, 6 pp.

M. Iwaya et al., "Reduction of Etch Pit Density in Organo-metallic Vapor Phase Epitaxy–Grown GaN on Sapphire by Insertion of a Low–Temperature–Deposited Buffer Layer Between High–Temperature–Grown GaN," Jpn. J. Appl. Phys., 1998, 37:L316–L318.

S. Keller et al., "Spiral Growth of InGaN Nanoscale Islands on GaN," Jpn. J. Appl. Phys., 1998, 37: L431–L434.

P. Kozodoy et al., "Electrical Characterization of GaN p–n Junctions With and Without Threading Dislocations," Appl. Phys. Lett., 1998, 73(7): 975–977.

(List continued on next page.)

*Primary Examiner*—Robert Kunemund
(74) *Attorney, Agent, or Firm*—Gates & Cooper LLP

(57) ABSTRACT

The present invention discloses a semiconductor film having a reduced dislocation density. The film comprises at least one interlayer structure, including a group III-nitride layer, a passivation interlayer disposed on the group III-nitride layer, interrupting the group III-nitride layer, and an island growth interlayer disposed on the passivation interlayer, and interrupting the group III-nitride layer. A method of making a semiconductor film of the present invention comprises producing a semiconductor film including at least one interlayer structure, each interlayer structure produced by the substeps of growing a group III-nitride layer, depositing a passivation interlayer on the group III-nitride layer, depositing an island growth interlayer on the passivation interlayer and continuing growing the group III-nitride layer.

32 Claims, 5 Drawing Sheets

OTHER PUBLICATIONS

S. Nakamura et al., "InGaN/GaN/AlGaN–Based Laser Diodes with Modulation–Doped Strained–Layer Superlattices Grown on an Epitaxially Laterally Overgrown GaN Substrate," Appl. Phys. Lett., 1998, 72(2): 211–213.

G. Parish et al., "High–Performance (Al,Ga) N–Based Solar–Blind Ultraviolet p–i–n Detectors on Laterally Epitaxially Overgrown GaN," Appl. Phys. Lett., 1999, 75(2): 247–249.

V. Srikant et al., "Mosaic Structure in Epitaxial Thin Films Having Large Lattice Mismatch," J. Appl. Phys., 1997, 82(9): 4286–4295.

S. Tanaka et al., "Anti–Surfactant in III–Nitride–Epitaxy—Quantum Dot Formation and Dislocation Termination," Jpn. J. Appl. Phys., 2000, 39: L381–L834.

S. Tanaka et al., "Self–Assembling GaN Quantum Dots on $Al_xGa_{1-x}N$ Surfaces Using a Surfactant," Appl. Phys. Lett., 1996, 69(26): 4096–4098.

A. Usui et al., "Thick GaN Epitaxial Growth with Low Dislocation Density by Hydride Vapor Phase Epitaxy," Jpn. J. Appl. Phys., 1997, 36: L899–L902.

* cited by examiner

| d (silicon nitride) (Å) | Procedure B1 FWHM (002)/FWHM (102) (arcsec) | Procedure B2 FWHM (002)/FWHM (102) (arcsec) |
| --- | --- | --- |
| 0 | 393/872 | |
| 0.07 | | 300/540 |
| 0.14 | 393/720 | 300/450 |

METHOD TO REDUCE THE DISLOCATION DENSITY IN GROUP III-NITRIDE FILMS

CROSS-REFERENCE TO RELATED APPLICATIONS

This application claims priority under 35 U.S.C. §119(e) to U.S. Provisional Patent Application No. 60/220,035, filed Jul. 21, 2000, by Umesh K. Mishra and Stacia Keller, and entitled "METHOD TO REDUCE THE DISLOCATION DENSITY IN GROUP III-NITRIDE FILMS," which application is incorporated by reference herein.

STATEMENT REGARDING FEDERALLY SPONSORED RESEARCH OR DEVELOPMENT

This invention was made with Government support under Grant No. N00014-96-1024, awarded by the Navy. The Government has certain rights in this invention.

BACKGROUND OF THE INVENTION

1. Field of the Invention

The present invention relates to nitride films, and particularly methods to reduce the dislocation density in group III nitride films for semiconductor devices.

2. Description of the Related Art (Note: This application references a number of different publications as indicated throughout the specification by reference numbers enclosed in brackets, e.g., [x]. A list of these different publications ordered according to these reference numbers can be found below at the end of the Detailed Description of the Preferred Embodiment. Each of these publications is incorporated by reference herein.)

Gallium Nitride (GaN) epitaxial films are typically obtained through heteroepitaxy on sapphire, silicon carbide, or silicon substrates since single crystalline GaN substrates are still not commercially available. Due to the lattice mismatch and the different chemical nature of the individual substrates, the threading dislocation densities in GaN films are typically on the order of $10^8$–$10^9$ cm$^{-2}$ on sapphire and silicon carbide and between $10^9$ and $10^{11}$ cm$^{-2}$ on silicon substrates. These dislocation densities are obtained even after the application of advanced nucleation schemes, where the growth is initiated with the deposition of a very thin (Al)GaN or AlN nucleation layer at growth conditions different from the main GaN bulk layer. [1]

To further reduce the dislocation density in GaN films, several forms of epitaxial lateral overgrowth of GaN have been developed, the use of which resulted in virtually dislocation-free material in the overgrown regions. [2,3] Applying this technique, GaN-based laser diodes with a lifetime of more than 10,000 h have been obtained. [4] Furthermore, the leakage current in p-n junctions and the dark current in photodetectors could be significantly reduced. [5,6] However, epitaxial lateral over-growth involves several growth and processing steps, making it a relatively time-consuming and expensive method. Dislocation reduction has also been observed after insertion of multiple GaN or AlN nucleation layers. [7]

There is a need for methods of reducing the dislocation density in nitride films, particularly for semiconductor light emitting device applications. There is also a need for such methods which may be performed quickly and inexpensively. The present invention meets these needs.

SUMMARY OF THE INVENTION

The present invention discloses a semiconductor film having a reduced dislocation density. The film comprises at least one interlayer structure, including a group III-nitride layer, a passivation interlayer disposed on the group III-nitride layer, interrupting the group III-nitride layer, and an island growth interlayer disposed on the passivation interlayer, and interrupting the group III-nitride layer. A method of making a semiconductor film of the present invention comprises producing a semiconductor film including at least one interlayer structure, each interlayer structure produced by the substeps of growing a group III-nitride layer, depositing a passivation interlayer on the group III-nitride layer, depositing an island growth interlayer on the passivation interlayer and continuing growing the group III-nitride layer.

In one embodiment of the present invention, dislocation reduction in GaN films grown on sapphire and silicon substrates is achieved by inserting thin InGaN layers grown in a selective island growth mode after passivation of the GaN surface with a submonolayer of silicon nitride. The present invention discloses a method that is most effective at reducing the pure edge dislocation density when it is high, i.e., >$10^{10}$ cm$^{-2}$. Thus, the structural quality of typically highly dislocated GaN on silicon films is significantly improved. The results are visible in a reduction of the (0002) full width at half maximum (FWHM) from 1300 arcsec for ordinary GaN on silicon to 800 arcsec for GaN films with silicon nitride/InGaN interlayers. In the case of GaN layers grown on sapphire (dislocation density~$10^9$ cm$^{-2}$), the method resulted mainly in a reduction of the FWHM of the ($10\bar{1}2$) and ($20\bar{2}1$) diffraction peaks.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In a preferred embodiment InGaN inter-layers are grown in a selective island growth mode after partially passivating the GaN surface with silicon nitride, on the structural properties of GaN films grown on silicon and sapphire substrates. The growth of InGaN has shown that InGaN films have a high tendency to grow in a spiral growth mode around threading dislocations with a screw component. InGaN spiral islands were obtained, when the GaN surface was partially passivated with disilane under formation of a submonolayer of silicon nitride (henceforth referred to as "$Si_xN_y$") prior to deposition of the InGaN layer. [8, 9] It should be understood, however, that the present invention is not limited to embodiments using partial passivation or selective island growth modes.

In the present invention, the selective island growth of InGaN can be utilized to reduce the dislocation density in GaN films. In particular, the effect of the thickness of the silicon nitride layer and the number of $Si_xN_y$/InGaN interlayers improves the structural quality of the films. This may be evaluated by high resolution x-ray diffraction.

Figure 1:
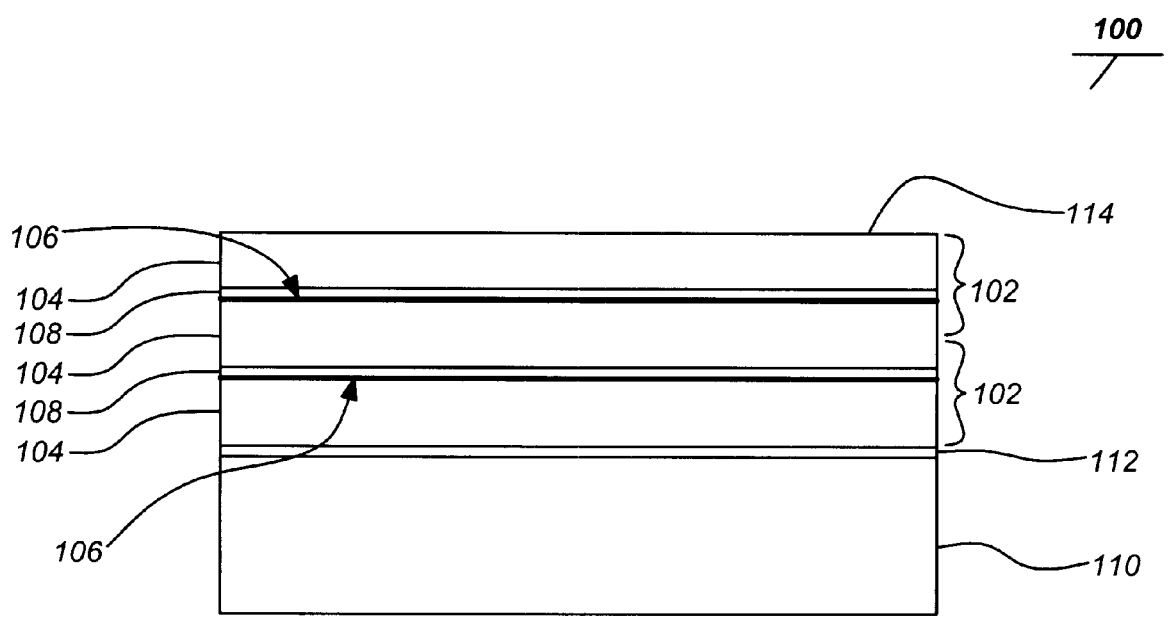
FIG. 1 illustrates a typical semiconductor film of the invention.

FIG. 1 illustrates a typical semiconductor film of the invention. The invention is generally directed to a semiconductor film 100 including at least one interlayer structure 102 including a group III-nitride (such as GaN) layer 104, a passivation interlayer 106 disposed on the group III-nitride layer 104 and an island growth interlayer 108 (such as InGaN) disposed on the passivation layer 106. The passivation layer 106 is typically composed of silicon nitride or silicon dioxide, however other passivating materials may also be used. A continued growth of the group III-nitride layer 104 (which is also the beginning of second interlayer structure 102) completes the first interlayer structure 102. Two such interlayer structures 102 are preferred. In addition, the invention is typically formed on a substrate 110 having a nucleation layer 112 disposed thereon and a cap layer 114 (which is also the continued growth of the final group III-nitride layer 104) is deposited on the uppermost interlayer structure 102.

Figure 2A:
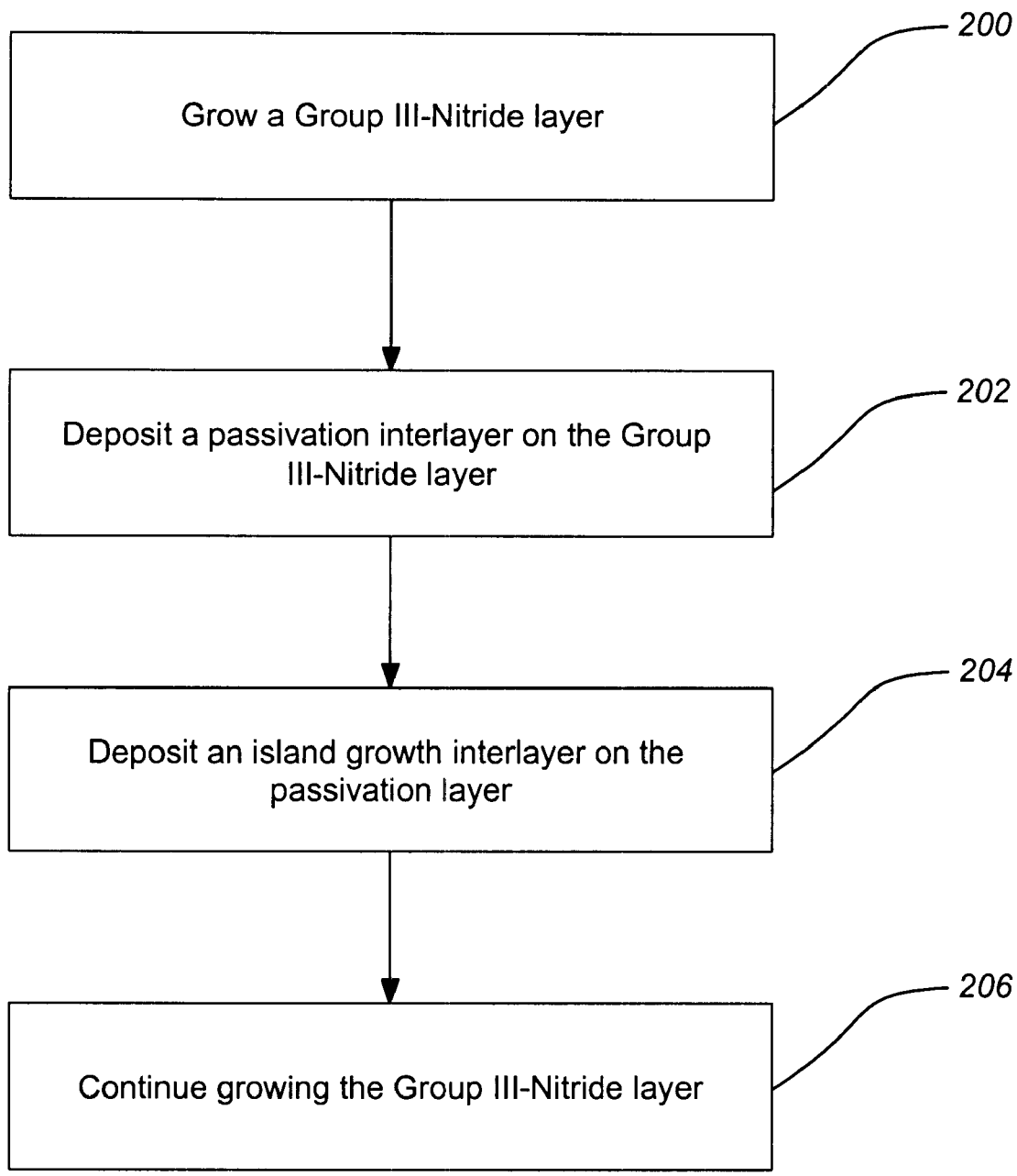
FIGS. 2A and 2B are flowcharts illustrating methods of making semiconductor films of the invention.
Figure 2B:
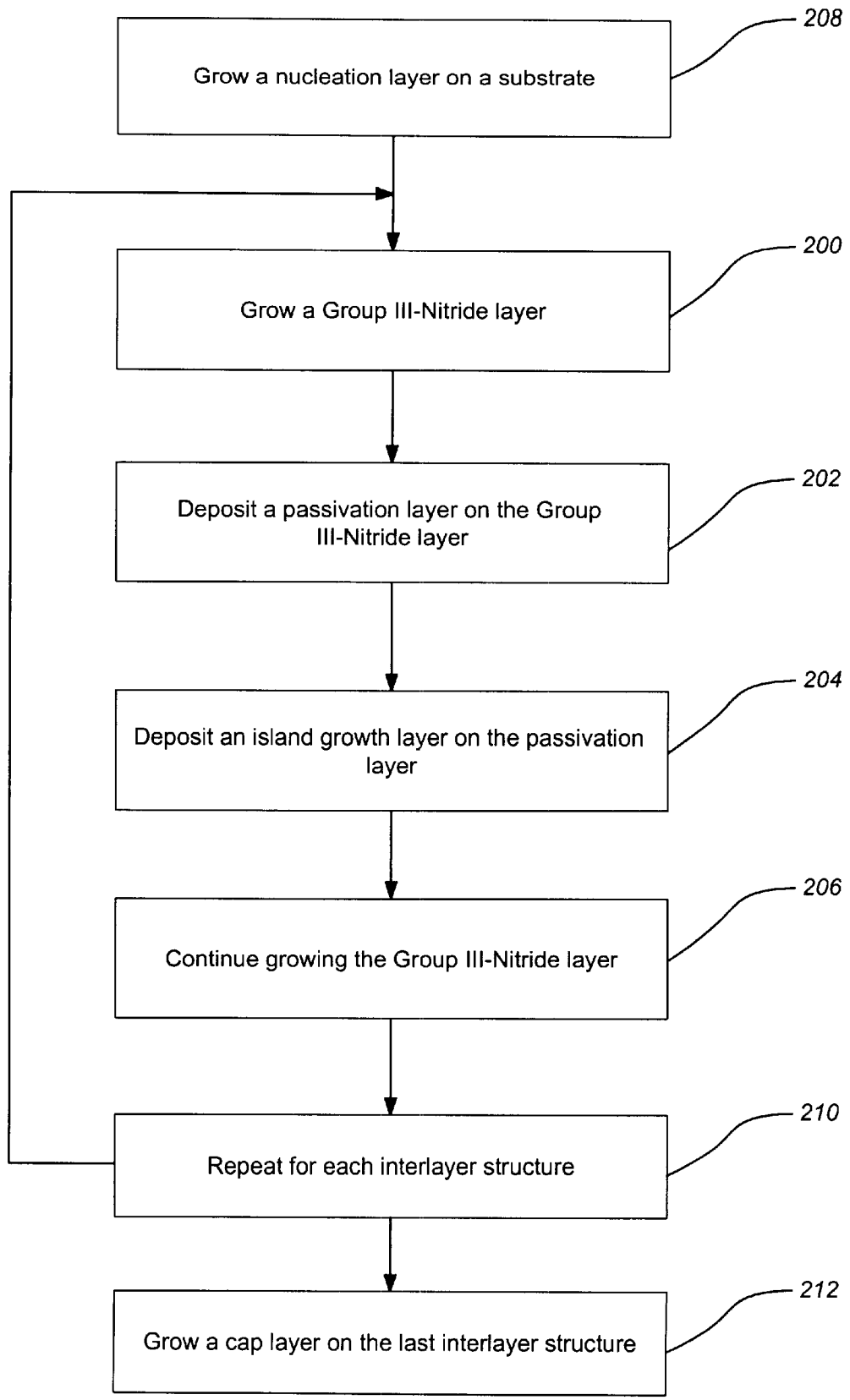

It should be noted that, in addition to $Si_3N_4$ and $SiO_2$, the passivation layer may be formed of any material which will produce a group III-nitride growth perturbation which can be initiated by the deposition of at least one layer to stop the dislocation propagation. Any inorganic dielectric passivating material known to those skilled in the art may be used FIGS. 2A and 2B are flowcharts illustrating methods of making semiconductor films 100 of the invention. FIG. 2A is a flowchart of the steps of making an interlayer structure 102 of the invention. Beginning at block 200, a group III-nitride layer 104 is grown. Next, a passivation layer is deposited on the group III-nitride layer at block 202. Then, an island growth layer is deposited on the passivation layer at block 204. Finally, growing the group III-nitride layer 104 is continued at block 206. FIG. 2B is a flowchart of the steps of making a semiconductor film of the invention. Beginning at block 208, a nucleation layer 112 is formed on a substrate 110. Next, at least one interlayer structure 102 is formed by the substeps 200-204 of FIG. 2A. Substeps 200-204 are repeated for each interlayer structure 102 at block 210. Finally, a cap layer 114 is grown on the last interlayer structure 102 at block 212. Further details of the steps will be described hereafter.

All epitaxial layers in the present invention may be grown by metal-organic chemical vapor deposition using the precursors trimethylgallium (TMGa), trimethylaluminum (TMAl), trimethylindium (TMIn), ammonia, and disilane. Typical embodiments of the invention are grown with two $Si_xN_y$/InGaN layers 106, 108, separated by 0.1–5 μm GaN layers 104 to form the interlayer structures 102. The passivation layers may range from 0.05–5 Å in thickness.

For samples grown on silicon substrate 110 (procedure A), the growth may be initiated with the deposition of a 100-nm-thick AlN nucleation layer 112 at 900° C., followed by the growth of a 1.7 μm of GaN layer 104 at a temperature of 1080° C. Following this, the TMGa injection is stopped and 2–10 nmol/min disilane is added for 16–48 seconds to form the passivation layer 106. The 12-nm-thick $In_{0.1}Ga_{0.9}N$ layer 108 which follows is deposited at 790° C. using a TMGa and TMIn flow of $f_{TMGa}$=0.6 μmol/min and $f_{TMIn}$=12 μmol/min and an ammonia flow of $f_{NH_3}$=0.32 mol/min. After deposition of the InGaN layer 108, the wafer temperature is raised to 1070° C. and a 0.5 μm GaN layer 104 is deposited. Next, the GaN growth is interrupted again and a second passivation layer 106, a submonolayer of silicon nitride, is grown, followed again by an InGaN layer 108 under the same conditions as the previous one. The structure is completed with the deposition of a 0.8 μm thick GaN cap layer 114.

For the first set of samples grown on c-plane sapphire substrate 110 (procedure B1), the growth is initiated with a 20-nm-thick GaN nucleation layer 112, followed by the growth of a 0.5 μm GaN layer 104 at 1070° C. Afterwards 0.15 Å passivation layer 106 of silicon nitride followed by a 12 nm InGaN layer 108 is deposited in the same manner as described for the growth on silicon substrates 110. The growth is continued with the deposition of a 0.5 μm GaN layer 104, a second 0.15-Å-thick passivation layer 106 of silicon nitride, a 12 nm InGaN layer 108, and completed with 2 μm cap layer 114 of GaN. The effect of the number of $Si_xN_y$/InGaN interlayers is shown in a second set of samples with four $Si_xN_y$/InGaN interlayers, all separated by 0.5 μm GaN to form interlayer structures 102. The thickness of the cap layer 114 may be reduced to 1 μm to keep the total thickness of the epitaxial layer constant.

In the case of the second set of samples grown on sapphire substrate 110 (procedure B2), the thickness of the GaN layer 102 prior to deposition of each of the two InGaN layers 108 of the interlayer structure 102 is increased to 3 μm, and the thickness of the GaN cap layer 114 to 2.5 μm.

The average thickness of the passivation layers 106, the $Si_3N_4$ submonolayers ($Si_xN_y$), may be calculated from the results obtained for the deposition of thick $Si_3N_4$ layers on silicon under similar conditions, and assuming a homogeneous distribution of silicon over the surface. [10]

The structural quality of the invention may be evaluated by high resolution x-ray diffraction using a PHILIPS MATERIALS RESEARCH diffractometer equipped with a four crystal [Ga(220)] monochromator utilizing the Cu K/α line of λ=0.15406 nm. All rocking curves may be obtained in the symmetric geometry (ω=θ). For the off-axis scans, the wafer is tilted about the ψ axis (commonly referred to as χ on many four-circle diffractometers) by the appropriate angle. The full width at half maximums (FWHMs) of the on- and off-axis diffraction peaks are a measure of the mosaic in the epitaxial layer and can each be related to specific types of threading dislocations (TDs). The FWHM of the symmetric (0002) diffraction peak is related to the tilt of the subgrains with respect to the substrate, and thus to the density of pure screw and mixed TDs. The off-axis ($10\bar{1}2$) and ($20\bar{2}1$) FWHMs result from a combination of the tilt and the twist of the subgrains and are related to the density of mixed and pure edge TDs. Thereby, the sensitivity toward pure edge TDs increases with increasing asymmetry (increasing ψ). [11]

Figure 3:
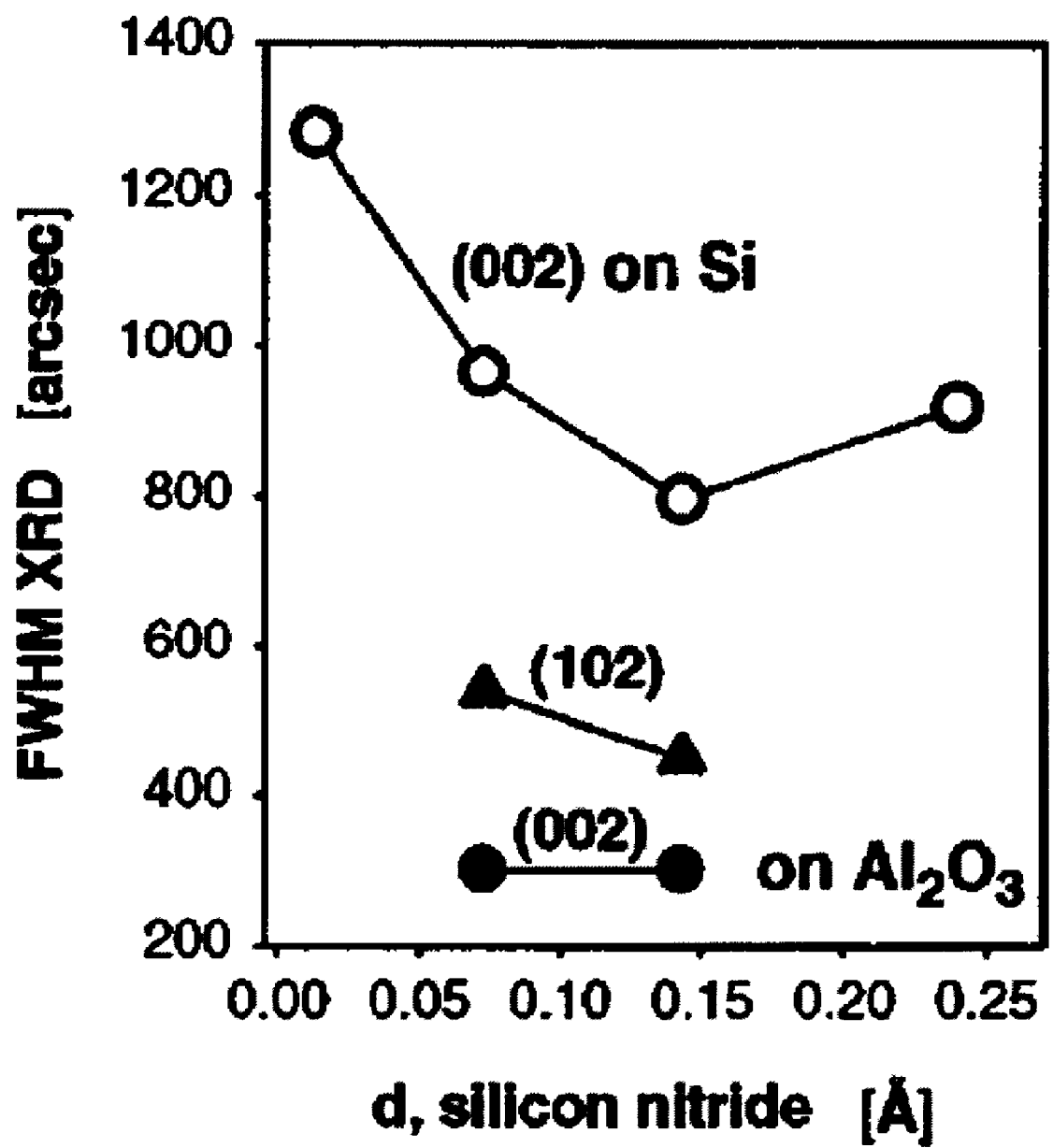
FIG. 3. is a plot of FWHM of the (0002) and ($10\bar{1}2$) diffraction peaks for samples grown with two silicon nitride/InGaN interlayers of different thickness on silicon (open symbols) and sapphire substrates (closed symbols) following procedures A and B2, respectively.

FIG. 3 shows the dependence of the FWHM of the (0002) and ($10\bar{1}2$) rocking curves on the average thickness of the silicon nitride passivation layers 106 found for samples grown on silicon substrates 110 following procedure A and samples grown on sapphire substrates 110 via procedure B2. Since the island growth of InGaN layer 108 depends on the predeposition of silicon nitride, first the influence of the silicon nitride layer 106 thickness was investigated. In the case of the samples grown on silicon 110, the films grown in a regular manner without $Si_xN_y$/InGaN interlayers were of poor crystalline quality (TD density ~$10^{11}$ cm$^{-2}$), as visible in the wide FWHM of the (0002) diffraction peak of about 1300 arcsec. (The poor quality was mainly related to the fact that the growth conditions of the AlN nucleation layer 112 had not been fully optimized.) However, the crystalline quality of the GaN-on-silicon layers 104 is significantly improved by inserting the two $Si_xN_y$/InGaN interlayer structures 102. The FWHM of the (0002) diffraction peak decreased from 1280 to 795 arcsec for a silicon nitride layer 106 thickness of 0.14 Å. A further increase in the silicon nitride layer 106 thickness causes the layer quality to degrade again, and the FWHM increases to 920 arcsec.

Figures 4, 5:
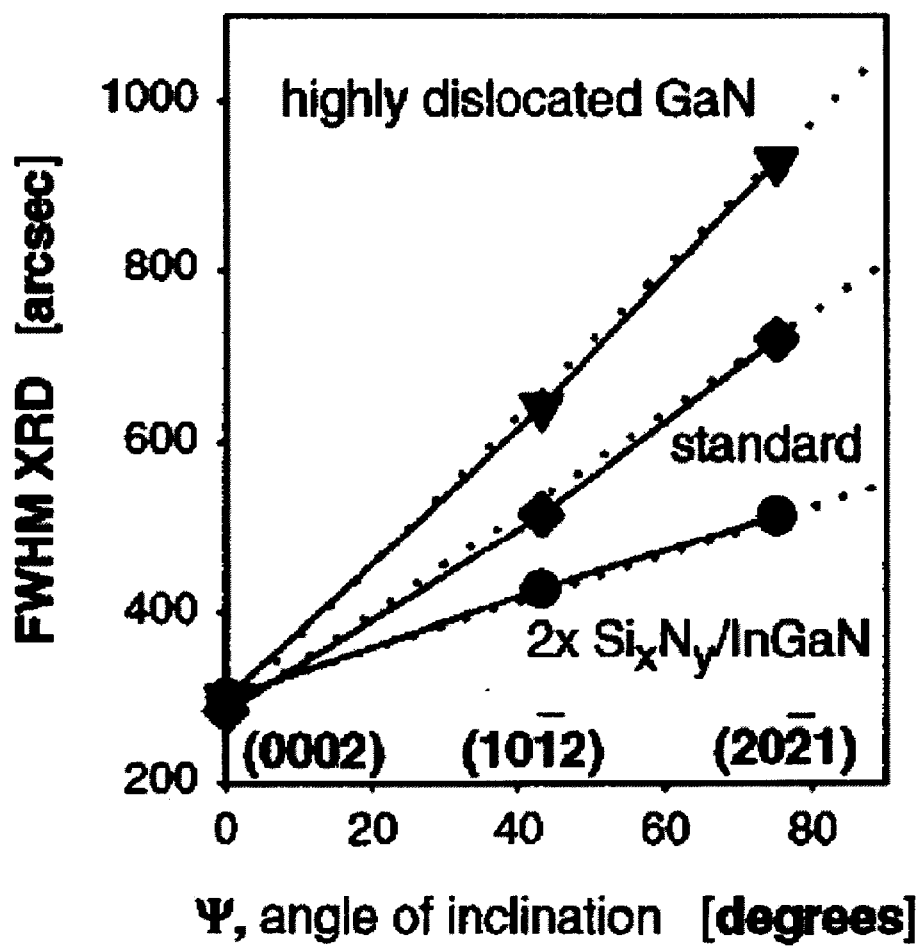
FIG. 4 is a table of the (0002) and ($10\bar{1}2$) diffraction peak for GaN films of the present invention.
FIG. 5 is a plot of FWHM of the (0002), ($10\bar{1}2$), and ($20\bar{2}1$) diffraction peaks for GaN grown on sapphire under not fully optimized growth conditions, called "highly dislocated GaN," standard conditions, and with two $Si_xN_y$/InGaN interlayers following procedure B2 [d($Si_xN_y$)=0.14 Å].

FIG. 4 is a table of the (0002) and (10$\bar{1}$2) diffraction peak for GaN films 100 of the present invention. For the samples grown on sapphire substrates 110, which were of higher crystalline quality when grown in a regular manner (TD density<$10^9$ cm$^{-2}$) the insertion of the $Si_xN_y$/InGaN interlayers results in a decrease of the FWHM of the asymmetric (10$\bar{1}$2) diffraction peak but did not affect the FWHM of the symmetric (0002) diffraction.

Samples with different numbers of $Si_xN_y$/InGaN interlayers may be grown on sapphire substrates 110 following procedure B1, using the optimum $Si_xN_y$ layer 106 thickness of 0.14 Å, as determined in experiments. The lower crystalline quality of these samples [TD density~(5–8)×$10^9$ cm$^{-2}$] compared to those grown following procedure B2 is related to the low thickness of the GaN layer 104 prior to deposition of the first $Si^xN^y$/InGaN layer. For samples without, with two, and with four interlayers (10$\bar{1}$2) FWHM, values of 870, 720 and 795 arcsec, respectively, have been measured (not shown). The corresponding values of the (0002) FWHMs were 390, 390 and 420 arcsec. The results demonstrate that the increase of the number of $Si_xN_y$/InGaN interlayers from two to four caused the crystalline quality to degrade again. Obviously, the $Si_xN_y$/InGaN interlayers can also create new defects if too high in number. For this reason, embodiments using two $Si_xN_y$/InGaN interlayers may be preferred, however the invention is not limited to two interlayer structures.

FIG. 5 displays the dependence of the FWHM of the x-ray diffraction peak on increasing inclination angle ψ during the measurement for three different GaN film 100 samples. Since the sensitivity of the diffraction measurement with respect to pure edge TDs increases with increasing ψ, the FWHM of the (20$\bar{2}$1) diffraction peak reflects their density even more strongly than the (10$\bar{1}$2) diffraction peak. Furthermore, the mosaic due to pure edge dislocations may be estimated through extrapolation of the data toward ψ=90°. [11] The graph illustrates the improved crystalline quality of the sample with two $Si_xN_y$/InGaN interlayers using the optimum silicon nitride layer 106 thickness of 0.14 Å, exhibiting a FWHM of the (20$\bar{2}$1) diffraction peak of 500 arcsec in comparison to the standard GaN film (720 arcsec). The highly dislocated GaN film (TD density of 5×$10^9$ cm$^{-2}$), which was grown under growth conditions not fully optimized, shows an even broader (20$\bar{2}$1) FWHM of 910 arcsec. The results demonstrate that the crystalline quality of GaN films 100 can be significantly improved through the insertion of the $Si_xN_y$/InGaN interlayers. Although a homogeneous distribution of Si atoms on the GaN surface may be assumed in calculating the $Si_xN_y$ layer 106 thickness, the Si atoms accumulate in surface areas with a high density of N-dangling bonds and specifically at the surface sites created by the intersection of the edge dislocations with the GaN layer 104 surface. The thin silicon nitride layer 106 masks the dislocation, preventing the adsorption of Ga and N species. In contrast, the intersections of threading dislocations with screw character, which create an additional surface step, act as nucleation sites for the InGaN layer 108 growth resulting in the formation of the InGaN islands. The islands then overgrow the passivated areas of the GaN layer 104 surface. This mechanism is more effective the higher the TD density in the starting layer due to the closer dislocation distance.

CONCLUSION

In conclusion, dislocation reduction in GaN films grown on silicon and sapphire substrates may be observed through a passivation of the GaN surface with silicon nitride. The subsequently grown InGaN islands overgrow areas with pure edge dislocations. The present invention is most effective at reducing the pure edge dislocation density when it is high, i.e., >$10^{10}$ cm$^{-2}$. For highly dislocated GaN on silicon films (TD density $10^{11}$ cm$^{-2}$), the FWHM of the (0002) diffraction peak decreases from approximately 1300 to 800 arcsec after insertion of two silicon nitride/InGaN interlayers. In the case of GaN layers grown on sapphire (dislocation density~$10^9$ cm$^{-2}$), the method results mainly in a reduction of the FWHM of the (10$\bar{1}$2) and (20$\bar{2}$1) diffraction peaks. The described method is most effective for applications which do not require a complete elimination of dislocations.

Although the present invention has been detailed with respect to GaN, equivalently, the present invention may be extended to apply to all group III-nitrides, aluminum-, gallium-, indium- and boron- (AlN, GaN, InN, BN) and their alloys with phosphorous (P), arsenic (As) and antimony (Sb). In addition, as previously discussed, the passivation layer may be any material which produces a growth perturbation in the group III-nitride and thereby halts the dislocation propagation. The invention may also be applied to the growth of group-III nitrides on any compatible simple or complex oxide substrate known to those skilled in the art. Some examples include silicon, sapphire, silicon carbide, zinc oxide, lithium gallate, lithium aluminate and aluminum nitride.

This concludes the description including the preferred embodiments of the present invention. The foregoing description of the preferred embodiment of the invention has been presented for the purposes of illustration and description. It is not intended to be exhaustive or to limit the invention to the precise form disclosed. Many modifications and variations are possible in light of the above teaching.

It is intended that the scope of the invention be limited not by this detailed description, but rather by the claims appended hereto. The above specification, examples and data provide a complete description of the use of the invention. Since many embodiments of the invention can be made without departing from the spirit and scope of the invention, the invention resides in the claims hereinafter appended.

REFERENCES

The following references are all incorporated by reference herein:
1. H. Amano, N. Sawaki, I. Akasaki, and Y. Toyoda, Appl. Phys. Lett. 48, 353 (1986).
2. A. Usui, H. Sunakawa, A. Sakai, and A. Yamaguchi, Jpn. J. Appl. Phys., Part 2 36, L899 (1997).
3. T. Gehrke, K. J. Linthicum, D. B. Thomson, P. Rajagopal, A. D. Batch-elor, and R. F. Davis, MRS Internet J. Nitride Semicond. Res. 4S1, (1999).
4. S. Nakamura, M. Senoh, S. Nagahama, N. Iwasa, T. Yamada, T. Matsus-hita, H. Kiyoku, Y. Sugimoto, T. Kozaki, H. Umemoto, M. Sano, and K. Chocho, Appl. Phys. Lett. 72, 211 (1998).
5. P. Kozodoy, J. P. Ibbetson, H. Marchant, P. T. Fini, S. Keller, J. S. Speck, S. P. DenBaars, and U. K. Mishra, Appl. Phys. Lett. 73, 975 (1998).
6. G. Parish, S. Keller, P. Kozodoy, J. P. Ibbetson, H. Marchand, P. T. Fini, S. B. Fleischer, S. P. DenBaars, U. K. Mishra, and E. J. Tarsa, Appl. Phys. Lett. 75, 247 (1999).
7. M. Iwaya, T. Takeuchi, S. Yamaguchi, C. Wetzel, H. Amano, and I. Akasaki, Jpn. J. Appl. Phys., Part 2 37, L316 (1998).

8. S. Keller, U. K. Mishra, S. P. DenBaars, and W. Seifert, Jpn. J. Appl. Phys., Part 2 37, L431 (1998).
9. S. Tanaka, S. Iwai, and Y. Aoyagi, Appl. Phys. Lett. 69, 4096 (1996).
10. A. C. Abare, Ph.D. thesis, ECE Technical Report No. 00-04, Department of Electrical and Computer Engineering, University of California at Santa Barbara, March 2000.
11. V. Srikant, J. S. Speck, and D. R. Clarke, J. Appl. Phys. 82, 4286 (1997).
12. Tanaka, S.; Takeuchi, M.; Aoyagi, Y. Anti-surfactant in III-nitride epitaxy-quantum dot formation and dislocation termination. Japanese Journal of Applied Physics, Part 2 (Letters), vol.39, (no.8B), Japan Soc. Appl. Phys, Aug. 15, 2000. p. L831–4.

What is claimed is:

1. A semiconductor film, comprising:
    at least one interlayer structure, comprising
        a group III-nitride layer;
        a passivation interlayer disposed on the group III-nitride layer and interrupting the group III-nitride layer; and
        an island growth interlayer disposed on the passivation interlayer and interrupting the group III-nitride layer;
    wherein the interlayer structure reduces a dislocation density of the group III-nitride layer.

2. The semiconductor film of claim 1, wherein the group III-nitride layer is aluminum nitride (AlN), gallium nitride (GaN), indium nitride (InN) or boron nitride (BN), or alloys thereof with phosphorous (P), arsenic (As) or antimony (Sb).

3. The semiconductor film of claim 1, wherein the group III-nitride layer is approximately 0.1–5 μm thick.

4. The semiconductor film of claim 1, wherein the passivation interlayer is an inorganic dielectric.

5. The semiconductor film of claim 1, wherein the passivation interlayer is silicon nitride, silicon dioxide or magnesium nitride.

6. The semiconductor film of claim 1, wherein the passivation interlayer is approximately 0.05–5 Å thick.

7. The semiconductor film of claim 1, wherein the passivation interlayer is formed by approximately 2–10 nmol/min disilane added for approximately 16–48 seconds.

8. The semiconductor film of claim 1, wherein there is a first one of the interlayer structures disposed on a second one of the interlayer structures.

9. The semiconductor film of claim 1, wherein the island growth interlayer is indium gallium nitride (InGaN).

10. The semiconductor film of claim 9, wherein the InGaN interlayer comprises $In_{0.1}Ga_{0.9}N$.

11. The semiconductor film of claim 9, wherein the InGaN interlayer is deposited using a trimethylgallium (TMGa) and trimethylindium (TMIn) flow of approximately $f_{TMGa}$=0.6 μmol/min and approximately $f_{TMIn}$=12 μmol/min and an ammonia flow of approximately $f_{NH_3}$=0.32 mol/min.

12. The semiconductor film of claim 9, wherein the InGaN interlayer is approximately 12 nm thick.

13. The semiconductor film of claim 1, further comprising:
    a substrate;
    a nucleation layer disposed on the substrate; and
    cap layer;
    wherein the at least one interlayer structure is disposed on the nucleation layer and the cap layer is disposed on the at least one interlayer structure.

14. The semiconductor film of claim 13, wherein the substrate is a simple or complex oxide.

15. The semiconductor film of claim 13, wherein the substrate silicon, sapphire, silicon carbide, zinc oxide, lithium gallate, lithium aluminate or aluminum nitride.

16. The semiconductor film of claim 13, wherein the nucleation layer is aluminum, gallium, aluminum nitride, aluminum gallium nitride, aluminum gallium indium nitride or gallium nitride.

17. A method of making a semiconductor film, comprising the steps of:
    producing a semiconductor film including at least one interlayer structure, each interlayer structure produced by the substeps of:
        growing a group III-nitride layer;
        depositing a passivation interlayer on the group III-nitride layer; and
        depositing an island growth interlayer on the passivation interlayer;
        continuing growing the group III-nitride layer
    wherein the interlayer structure reduces a dislocation density of the group III-nitride layer.

18. The method of claim 17, wherein the group III-nitride layer is aluminum nitride (AlN), gallium nitride (GaN), indium nitride (InN) or boron nitride (BN), and alloys thereof with phosphorous (P), arsenic (As) or antimony (Sb).

19. The method of claim 17, wherein the group III-nitride layer is approximately 0.1–5 μm thick.

20. The method of claim 17, wherein the passivation interlayer is an inorganic dielectric.

21. The method of claim 17, wherein the passivation interlayer is silicon nitride, silicon dioxide or magnesium nitride.

22. The method of claim 17, wherein the passivation interlayer is approximately 0.05–5 Å thick.

23. The method of claim 17, wherein the passivation interlayer is formed by approximately 2–10 nmol/min disilane added for approximately 16–48 seconds.

24. The method of claim 17, wherein the island growth interlayer is indium gallium nitride (InGaN).

25. The method of claim 24, wherein the InGaN interlayer comprises $In_{0.1}Ga_{0.9}N$.

26. The method of claim 24, wherein the InGaN interlayer is deposited using a trimethylgallium (TMGa) and trimethylindium (TMIn) flow of approximately $f_{TMGa}$=0.6 μmol/min and approximately $f_{TMIn}$=12 μmol/min and an ammonia flow of approximately $f_{NH_3}$=0.32 mol/min.

27. The method of claim 24, wherein the InGaN interlayer is approximately 12 nm thick.

28. The method of claim 17, wherein there is a first one of the interlayer structures disposed on a second one of the interlayer structures.

29. The method of claim 17, further comprising the steps of:
    growing a nucleation layer on a substrate; and
    growing a cap layer;
    wherein the at least one interlayer structure is produced on the nucleation layer the nucleation layer and the cap layer is grown on the at least one interlayer structure.

30. The method of claim 29, wherein the substrate is a simple or complex oxide.

31. The method of claim 29, wherein the substrate is silicon, sapphire, silicon carbide, zinc oxide, lithium gallate, lithium aluminate or aluminum nitride.

32. The method of claim 29, wherein the nucleation layer is aluminum, gallium, aluminum nitride, aluminum gallium nitride, aluminum gallium indium nitride or gallium nitride.

* * * * *

UNITED STATES PATENT AND TRADEMARK OFFICE
CERTIFICATE OF CORRECTION

PATENT NO.    : 6,610,144 B2
DATED         : August 26, 2003
INVENTOR(S)   : Umesh Kumar Mishra and Stacia Keller It is certified that error appears in the above-identified patent and that said Letters Patent is hereby corrected as shown below:

Title page,
Item [56], References Cited, OTHER PUBLICATIONS, for "S. Tanaka et al., "Anti Surfactant in III-Nitride-Epitaxy-Quantum Dot Formation and Dislocation Termination," "L381" should read -- L831- --.

Signed and Sealed this

Eighteenth Day of November, 2003

JAMES E. ROGAN
*Director of the United States Patent and Trademark Office*